United States Patent
Friedmann et al.

(10) Patent No.: US 7,153,711 B2
(45) Date of Patent: Dec. 26, 2006

(54) METHOD FOR IMPROVING A DRIVE CURRENT FOR SEMICONDUCTOR DEVICES ON A WAFER-BY-WAFER BASIS

(75) Inventors: James B. Friedmann, Dallas, TX (US); Kaneez E-shaher Banu, Dallas, TX (US); Yuqing Xu, Plano, TX (US); Jeffrey G. Loewecke, Wylie, TX (US); James D. Vaughan, Blue Ridge, TX (US)

(73) Assignee: Texas Instruments Incorporated, Dallas, TX (US)

( * ) Notice: Subject to any disclaimer, the term of this patent is extended or adjusted under 35 U.S.C. 154(b) by 146 days.

(21) Appl. No.: 10/917,037

(22) Filed: Aug. 12, 2004

(65) Prior Publication Data

US 2006/0035394 A1 Feb. 16, 2006

(51) Int. Cl.
*H01L 21/66* (2006.01)
(52) U.S. Cl. ............................................. 438/14; 438/17
(58) Field of Classification Search ................ 438/14, 438/7, 12, 16, 17, 5, 6, 10, 11, 18
See application file for complete search history.

(56) References Cited

U.S. PATENT DOCUMENTS 6,556,303 B1 * 4/2003 Rangarajan et al. .... 257/E21.53
6,821,859 B1 * 11/2004 Raebiger et al. .............. 438/14

* cited by examiner

*Primary Examiner*—Kevin M. Picardat
(74) *Attorney, Agent, or Firm*—Peter K. McLarty; W. James Brady, III; Frederick J. Telecky, Jr.

(57) ABSTRACT

The present invention provides a method for manufacturing semiconductor devices, a method for manufacturing an integrated circuit, and a method for improving a drive current for semiconductor devices on a wafer-by-wafer basis. The method for manufacturing semiconductor devices, among other elements, includes patterning gate structures on a substrate (220), each of the gate structures having a profile associated therewith, and obtaining information representative of the profiles of the gate structures (240). In accordance with the present invention the information may then be fed forward to alter a manufacturing parameter associated with a drive current of the semiconductor devices (250).

20 Claims, 3 Drawing Sheets

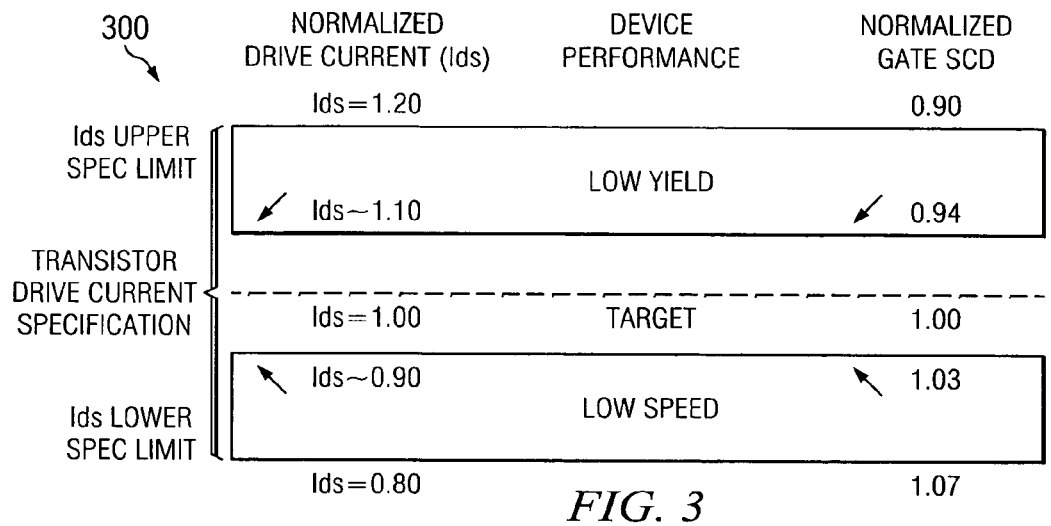
FIG. 3
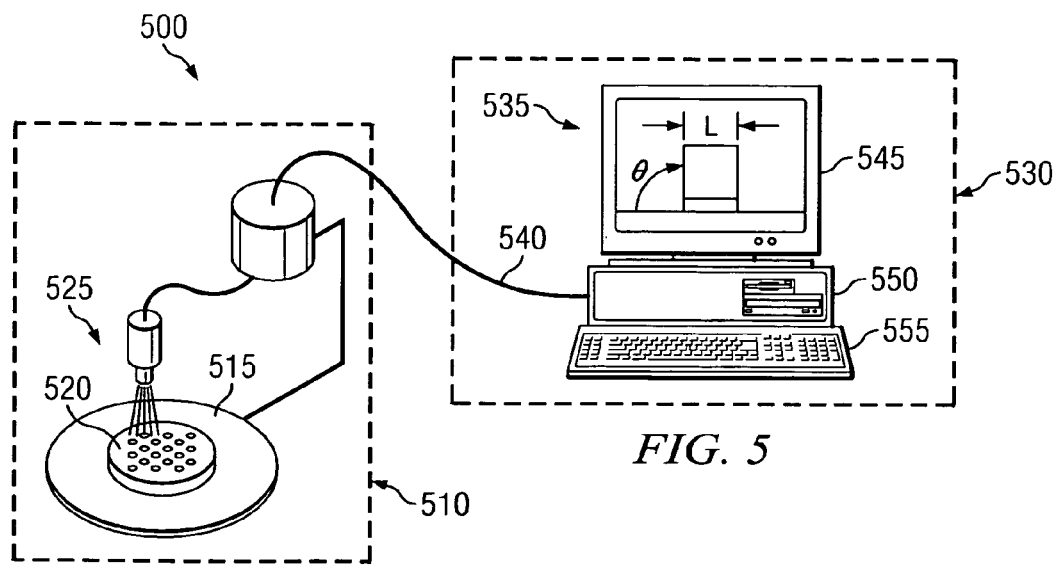
FIG. 4
FIG. 5

METHOD FOR IMPROVING A DRIVE CURRENT FOR SEMICONDUCTOR DEVICES ON A WAFER-BY-WAFER BASIS

TECHNICAL FIELD OF THE INVENTION

The present invention is directed, in general, to the manufacture of semiconductor devices, and more specifically to a method for improving a drive current for semiconductor devices on a wafer-by-wafer basis.

BACKGROUND OF THE INVENTION

Current demands for high density and performance associated with ultra large scale integration require submicron features, increased transistor and circuit speeds, and improved reliability. Such demands require formation of device features with high precision and uniformity, which in turn necessitates careful process monitoring, including frequent and detailed inspections of the devices while they are still in the form of semiconductor wafers.

One important process requiring careful inspection is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be integrated onto the wafer. Each mask in the series is used to transfer its corresponding pattern onto a photosensitive layer (i.e., a photoresist layer), which has been previously coated on a layer, such as a polysilicon or metal layer formed on the silicon wafer. The transfer of the mask pattern onto the photoresist layer is conventionally performed by an optical exposure tool such as a scanner or a stepper, which directs light or other radiation through the mask to expose the photoresist. The photoresist is thereafter developed to form a photoresist mask, and the underlying polysilicon or metal layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. Design rules set limits on critical dimensions ("CD"), which may be defined as any linewidth of interest in a device containing a number of different linewidths. The CD for most features in ultra large scale integration applications is on the order of a fraction of a micron, however, it generally depends on the specific feature.

As design rules shrink and process windows (i.e., the margins for error in processing) become smaller, inspection and measurement of surface features' profiles, which may include the surface features' CDs and sidewall angles are becoming increasingly important. Deviations of a feature's CD and sidewall angle from design dimensions may adversely affect the performance of the finished semiconductor device, particularly the finished semiconductor device's drive current.

Accordingly, what is needed in the art is a simple, cost-effective methodology for fast and meaningful identification of a feature's profile variation, as well as correction of any drive current issues that might be associated with the variation.

SUMMARY OF THE INVENTION

To address the above-discussed deficiencies of the prior art, the present invention provides a method for manufacturing semiconductor devices, a method for manufacturing an integrated circuit, and a method for improving a drive current for semiconductor devices on a wafer-by-wafer basis. The method for manufacturing semiconductor devices, among other elements, includes patterning gate structures on a substrate, each of the gate structures having a profile associated therewith, and obtaining information representative of the profiles of the gate structures. In accordance with the present invention the information may then be fed forward to alter a manufacturing parameter associated with a drive current of the semiconductor devices.

The method for manufacturing the integrated circuit, in addition to those elements of the method for manufacturing semiconductor devices, includes forming interconnects within dielectric layers located over the semiconductor devices to form an operational integrated circuit.

As previously mentioned, the present invention further includes a method for improving a drive current for semiconductor devices on a wafer-by-wafer basis. This method, in one embodiment, includes (1) providing a plurality of wafers, each of the plurality of wafers having a plurality of gate structures located on a substrate thereof, (2) measuring profiles of the gate structures of the semiconductor devices for each of the different plurality of wafers, the measured profiles providing information representative of the profiles of the gate structures of each of the wafers, and (3) feeding forward, on a wafer-by-wafer basis, the information representative of the measured profiles for each of the wafers to alter a manufacturing parameter associated with a drive current of the gate structures for each of the wafers.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 3 illustrates an exemplary table of known values for gate structure profiles;

FIG. 4 illustrates an exemplary table for the relationship between gate critical dimension and source/drain anneal temperature when employing the method for improving a drive current for semiconductor devices on a wafer-by-wafer basis in accordance with the present invention;

FIG. 5 illustrates a partial sectional view of an exemplary embodiment of a system for measuring profiles of the gate structures on each of the one or more wafers, applying the measured profiles to a table of known values to obtain information representative of the profiles, feeding forward the information to alter a manufacturing parameter associated with a drive current of the semiconductor devices on the one or more wafers, or any one or combination of those steps in accordance with certain steps of FIG. 2.

DETAILED DESCRIPTION

The present invention begins with the recognition that profiles of gate structures in semiconductor devices are very relevant to the semiconductor devices' drive currents. Given this recognition, the present invention discloses a method for feeding forward information representative of the profiles to alter a manufacturing parameter associated with a drive current of the semiconductor devices. Unique only to the present invention, the representative information may be fed forward on a wafer-by-wafer basis, allowing various different wafers within a lot (e.g., typically about 25 wafers) to be tailored individually. Thus, where the profiles for gate structures on a first wafer are different that profiles for gate structures on a second wafer, a subsequent manufacturing parameter associated with the drive current of the semiconductor devices may be independently tailored for the semiconductor devices on the first wafer and second wafer.

Figure 1:
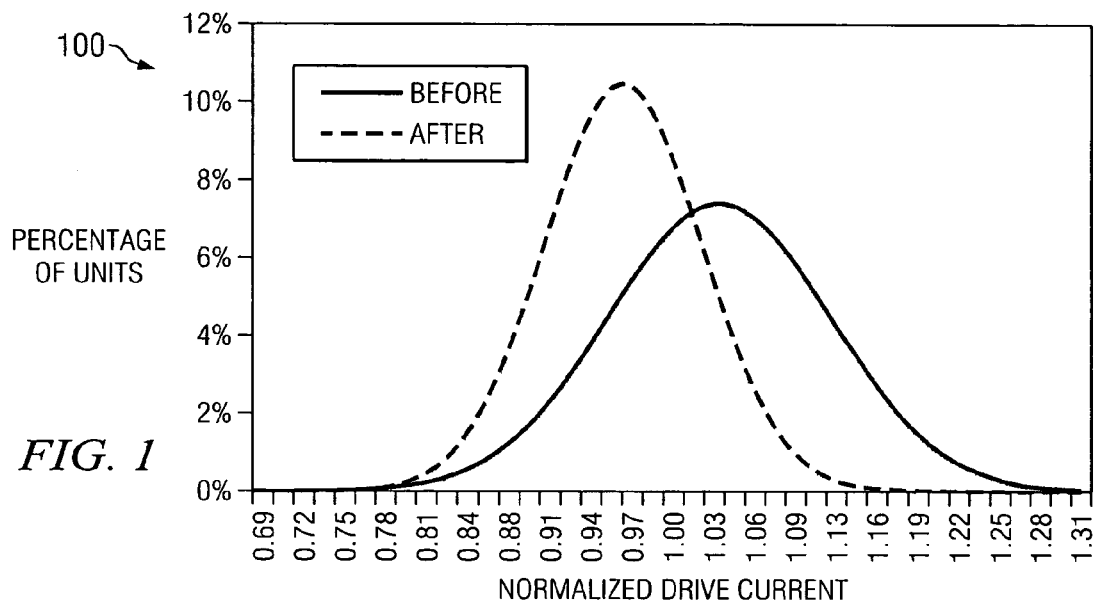
FIG. 1 illustrates a graph demonstrating the benefits that may be obtained using the wafer-by-wafer feeding forward of the information representative of the profiles of the gate structures on a given wafer.

Turning briefly to FIG. 1, illustrated is a graph 100 demonstrating the benefits that may be obtained using the wafer-by-wafer feeding forward of the information representative of the profiles of the gate structures on a give wafer. Graph 100 compares a given wafer's drive current, which is a strong function of the gate structure profile (e.g., in this case gate structure CD), to the normalized number of units. As is illustrated, the wafer-by-wafer feeding forward method, at least in the illustrated embodiment, resulted in a 30% reduction in drive current variability, improved speed distributions, and increased process and multiprobe yields. Accordingly, the inventive method solves the problems of systematic and random wafer-to-wafer process-induced variations in critical parameters such as transistor drive currents. Therefore, implementation of the inventive method may result in improved parametric and multiprobe yield.

Figure 2:
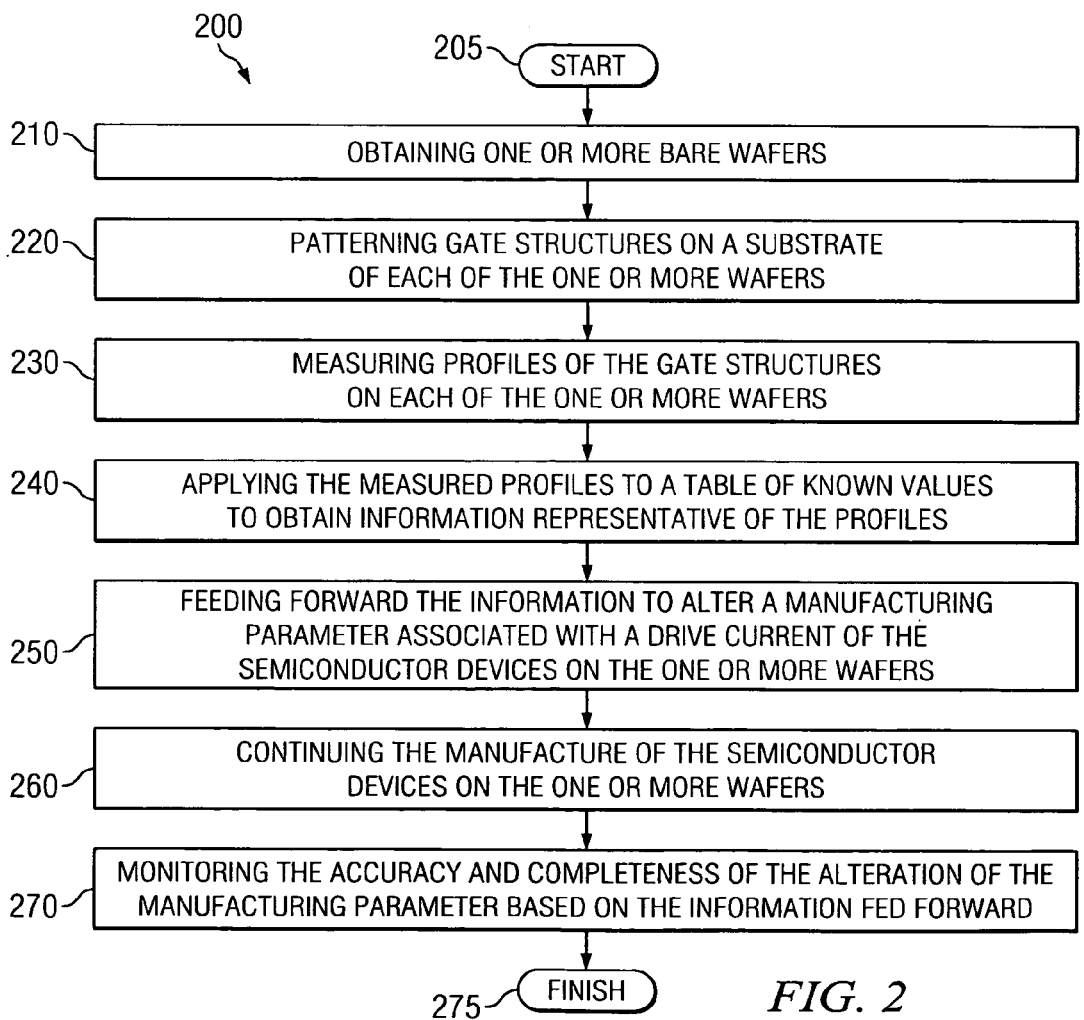
FIG. 2 illustrates a flow diagram depicting one embodiment of a method for manufacturing semiconductor devices in accordance with the principles of the present invention.

Turning now to FIG. 2, illustrated is a flow diagram 200 depicting one embodiment of a method for manufacturing semiconductor devices in accordance with the principles of the present invention. While the flow diagram 200 depicted in FIG. 2 includes about nine specific steps, those skilled in the art understand that fewer or more steps could be used and remain within the scope of the present invention. While many of the additional steps will not be discussed, certain ones of those additional steps will be discussed.

The method for manufacturing semiconductor devices begins in step 205. Thereafter, in a step 210, one or more wafers are obtained. The one or more wafers may be any known or hereafter discovered wafer that currently is or will be used in the manufacture of semiconductor devices. In the exemplary embodiment of the present invention, the one or more wafers are standard silicon wafers that have been processed up to the step of patterning the gate structures thereon. That is, the wafers already include isolation structures, any pre-pattern implants, a gate dielectric layer and a gate electrode layer thereon.

After obtaining the one or more wafers, which as discussed above may have a number of different features thereon, gate structures are patterned on each of the one or more wafers in a step 220. As is often the case, the gate structures on each of the one or more wafers are patterned as a lot, for example either sequentially or simultaneously. The present invention is not, however, limited to the aforementioned patterning scheme.

The gate structure patterning process of step 220 is conventional. For example, any exemplary lithographic process may be used to pattern the gate structures. Lithography refers to a process for pattern transfer between various media. The lithographic process may include forming a radiation sensitive resist coating over the layer to be patterned, in this case the blanket layers of gate dielectric material and gate electrode material. The radiation sensitive resist coating may then be patterned by selectively exposing the resist through a mask. In turn, the exposed areas of the coating become either more or less soluble than the unexposed areas, depending on the type of resist. A solvent developer may then be used to remove the less soluble areas leaving the patterned resist layer. After the resist layer is patterned, the gate structures may be etched using the patterned resist layer as a mask to transfer the pattern to the blanket layers of gate dielectric material and gate electrode material. Etch processes, among others, might include plasma etching, reactive ion etching, wet etching, or combinations thereof.

It is known that variations in the photolithography and etch processes between the one or more wafers in the lot may affect the profiles of the resulting gate structures among the one or more wafers in the lot. For example, the removal of one wafer from the photolithography or etching device and placement of a different wafer within the device may cause the profiles of the gate structures on the first wafer to be different from the profiles of the gate structures on the second wafer. Other process variables may also affect the profiles.

After patterning the gate structures in step 220, the profiles of the gate structures on each of the one or more wafers may be measured in a step 230. While many different devices and techniques may be used to measure the various profiles of the gate structures on the one or more wafers, the present invention believes that a scatterometer is best suited at this time. Whether it be integrated or stand alone, the scatterometer provides quick, accurate and reliable gate structure profile information. Previous techniques, such as using a scanning electron microscopes (SEM), typically cannot accurately provide this information. Further, even if the previous techniques were able to obtain this data, those techniques would be entirely too slow to be practical.

The gate structure profile information that is obtained includes one or more features. In an exemplary embodiment, the gate critical dimension (CD) is the gate structure profile measured. Nevertheless, gate structure sidewall angle, as well as other pertinent profile information, may also be obtained in the step 230.

Thereafter, in a step 240, the measured profiles for the gate structures of each of the one or more wafers is compared to a table of known values for gate structure profiles, to obtain information representative of the profiles for the gate structures of the different wafers. Turning briefly to FIG. 3, depicted is an illustrative example of such a table 300. With reference to FIG. 3, the table might apply the gate CD measurements of the wafers to known parametric transistor specs to determine the drive current of the device that will result. This information may then be used to determine what, if any, manufacturing parameters may be adjusted to optimize the performance of the resulting transistor based upon the measured gate structure profile for each of the one or more wafers.

After determining what manufacturing parameter may be adjusted to optimize the performance of the resulting transistor for each of the one or more wafers, in a step 250, that representative information may be fed forward to the specific manufacturing process to alter, or in an exemplary embodiment optimize, the drive current of the semiconductor devices on the one ore more wafers. Therefore, the information is fed forward on a wafer-by-wafer basis, which allows the drive current to be tailored for the semiconductor devices on a given wafer independent of the drive current for the other wafers. While in many instances the drive current will be optimized to about the same value across the different wafers, it is now attainable even though the gate structures on the different wafers may have different profiles. Again, this allows systematic and random wafer-to-wafer gate structure profile variations to be minimized, as related to transistor drive current.

Those skilled in the art understand the many different ways in which this information may be fed forward to affect the transistor drive current on a wafer-by-wafer basis. What those skilled in the art are not generally aware of are the specific manufacturing parameters that may be adjusted to account for the differences in the gate structure profiles. First, and foremost, it is believed that the gate structure profile information may be used to adjust the source/drain anneal temperature used to activate the source/drain regions. By modifying this anneal temperature up to about 15 degrees either way, and more specifically up to about 5 degrees either way, the drive current may be tailored. It is also believed that adjustments to the sidewall spacer thickness, pocket/halo implant dose, pocket/halo implant energy, source/drain extension implant dose, source/drain extension implant energy, and other similar parameters may also be adjusted to tailor the drive currents.

Reference is now made to FIG. 4, which depicts an exemplary table 400 for the relationship between gate critical dimension and source/drain anneal temperature when employing the method for improving a drive current for semiconductor devices on a wafer-by-wafer basis in accordance with the principles of the present invention. The values for this table 400 may be established from knowledge of the relationship between source/drain anneal temperature and transistor drive current in combination with the information found in table 300.

In a step 260, after tailoring the specific manufacturing parameter chosen to alter the drive currents on a wafer-by-wafer basis, the manufacturing of the semiconductor devices may continue for the wafers. Depending on what manufacturing parameter is chosen to tailor the drive currents, the additional manufacturing steps might include the formation of interlevel dielectric layers over the gate structures, and formation of interconnects within the interlevel dielectric layers to form an operational integrated circuit.

Thereafter, in an optional step 270, the accuracy and completeness of the alteration of the manufacturing parameter based on the information fed forward may be monitored. This may include measuring at least one wafer per lot per altered manufacturing parameter using an inline parametric probe. Not only does this information test the accuracy of the process, it allows certain information to be fed back to further optimize the process.

It should be noted that a number of various procedures or steps that might occur during a typical method consistent with the flow diagram of FIG. 2 are not shown therein. For example, not only must the gate structure profile information be fed forward, that gate structure profile information must be attributed to a specific wafer. Thus, the gate structure profile information might have the wafer number, location, slot position, etc., encoded therewith. Other procedures or steps not shown will undoubtedly also exist. Nevertheless, those steps would be known by one skilled in the art.

Referring briefly to FIG. 5, illustrated is a partial sectional view of an exemplary embodiment of a system 500 for measuring profiles of the gate structures on each of the one or more wafers, applying the measured profiles to a table of known values to obtain information representative of the profiles, feeding forward the information to alter a manufacturing parameter associated with a drive current of the semiconductor devices on the one or more wafers, or any one or combination of those steps in accordance with steps 230, 240, and 250 of FIG. 2. It should initially be noted that the system 500 may include many objects, and is not limited by what is illustrated in the embodiment shown in FIG. 5.

In the embodiment shown in FIG. 5, the system 500 includes a detection subsystem 510 and a comparison subsystem 530. The detection subsystem 510, in a preferred embodiment of the invention, may include a scatterometer 525. It should be noted, however, that the detection subsystem 510 may include other subsystems designed to measure the profiles of the gate structures and remain within the scope of the present invention.

As previously mentioned, the system 500 may further include a comparison subsystem 530. The comparison subsystem 530 may include any subsystem capable of accurately comparing information obtained from the detection subsystem 510. In the embodiment illustrated in FIG. 5, the comparison subsystem 530 includes a computer subsystem 535. The computer subsystem 535 may be coupled to the detection subsystem 510 via a cable 540, and may be configured to receive and process information from the detection subsystem 510. In one embodiment of the present invention, the computer subsystem 535 may be software residing on a conventional personal computer. The software embodiment includes source code, object code, libraries, executable programs and other software structures that cooperatively function together to achieve the functionality of the present invention. The computer subsystem 535 may also include a monitor 545, a chassis 550 or a keyboard 555. Alternatively, however, the monitor 545 and the keyboard 555 may be replaced by other conventional output and input devices, respectively.

It should be noted that any conventional computer system having at least one CPU that is suitable to function as the computer subsystem 535, including without limitation, hand-held units, laptop/notebooks, minis, mainframes and supercomputers, including RISC and parallel processing architectures, as well as combinations of such systems, may be used. Conventional computer system architecture is more fully discussed in *Computer Organization and Architecture*, by William Stallings, MacMillan Publishing Co. (3rd ed. 1993), which is also incorporated herein by reference. Alternative computer system embodiments may be firmware-based or hardware-based. It should also be noted that the comparison subsystem 530 is not limited to an external source and may be included within a logic provided in the detection subsystem 510. Moreover, the comparison subsystem 530 could be included within the software or factory automation of the tool used to alter the manufacturing parameter without departing from the scope of the present invention.

The comparison subsystem 530, in addition to the features discussed above, has the ability to feed forward the information that it obtains to other manufacturing subsystems, for example a subsystem capable of annealing the source/drains associated with the gate structures on the one or more wafers. It should be noted again that the system 500, and more particularly its components, is just one embodiment of a system that could be used to effectuate the unique method of the present invention.

Figure 6:
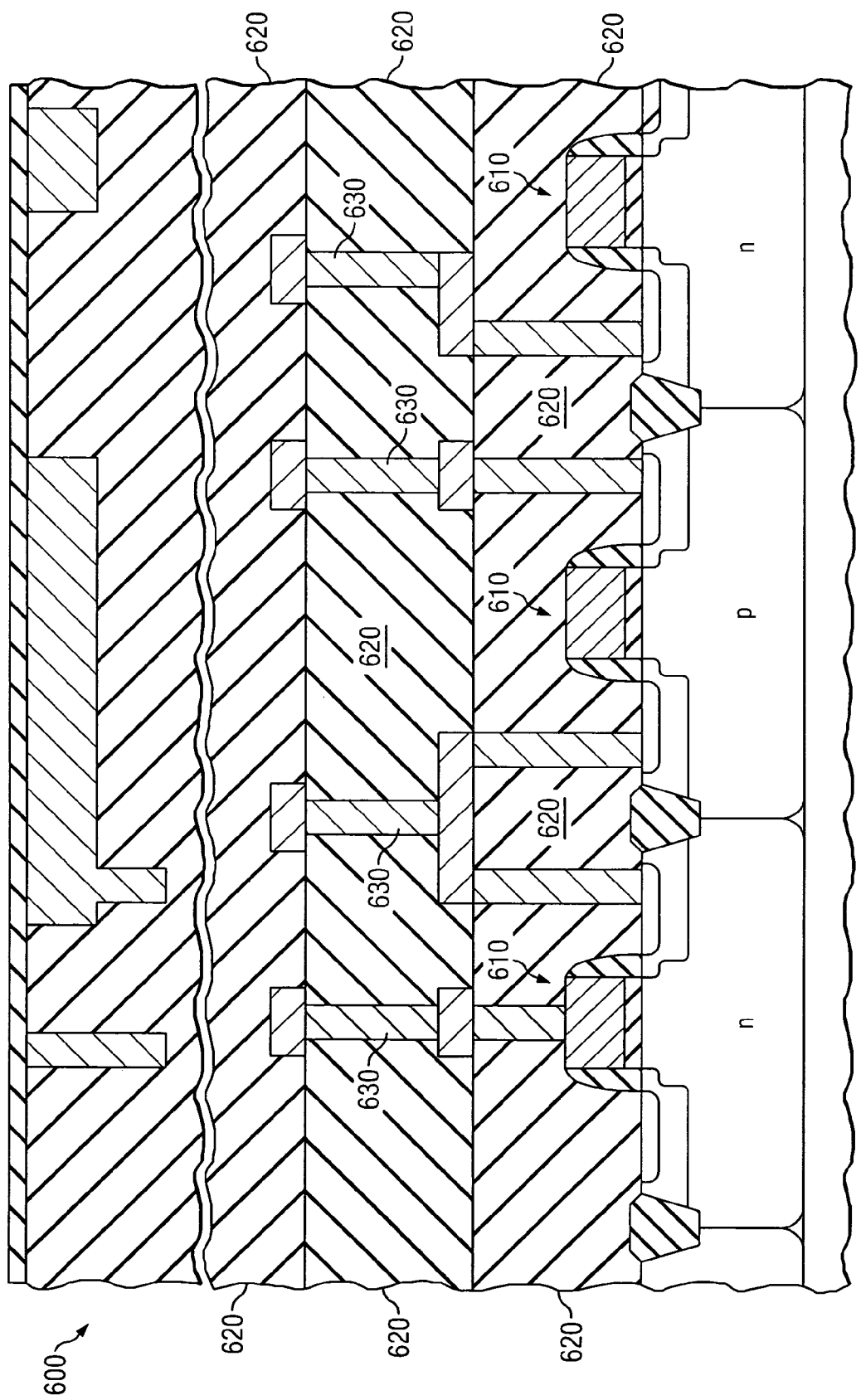
FIG. 6 illustrates an exemplary cross-sectional view of an integrated circuit (IC) constructed according to the principles of the present invention.

Referring now to FIG. 6, illustrated is an exemplary cross-sectional view of an integrated circuit (IC) 600 constructed according to the principles of the present invention. The IC 600 may include devices, such as transistors used to form CMOS devices, BiCMOS devices, Bipolar devices, as well as capacitors or other types of devices. The IC 600 may further include passive devices, such as inductors or resistors, or it may also include optical devices or optoelectronic devices. Those skilled in the art are familiar with these various types of devices and their manufacture. In the particular embodiment illustrated in FIG. 6, the IC 600 includes the devices 610 having dielectric layers 620 located thereover. Additionally, interconnect structures 630 are located within the dielectric layers 620 to interconnect various devices, thus, forming the operational integrated circuit 600.

Although the present invention has been described in detail, those skilled in the art should understand that they can make various changes, substitutions and alterations herein without departing from the spirit and scope of the invention in its broadest form.

What is claimed is:

1. A method for manufacturing semiconductor devices, comprising:
   patterning gate structures on a substrate, each of the gate structures having a profile associated therewith; and
   obtaining information representative of the profiles of the gate structures for a wafer, and feeding forward the information to alter a manufacturing parameter associated with a drive current of the semiconductor devices on a wafer-by-wafer basis.

2. The method as recited in claim 1 wherein obtaining information includes obtaining information using a scatterometer.

3. The method as recited in claim 1 wherein obtaining information representative of the profiles includes obtaining information representative of the critical dimensions of the gate structures.

4. The method as recited in claim 1 wherein obtaining information representative of the profiles includes obtaining information representative of sidewall angles of the gate structures.

5. The method as recited in claim 1 wherein feeding forward the information to alter a manufacturing parameter associated with a drive current of the semiconductor devices includes feeding forward the information to alter a source/drain anneal temperature.

6. The method as recited in claim 1 wherein feeding forward the information to alter a manufacturing parameter associated with a drive current of the semiconductor devices includes feeding forward information to alter a manufacturing parameter selected from the group consisting of sidewall spacer thickness, source/drain implant dose and source/drain implant energy.

7. The method as recited in claim 1 wherein obtaining information includes measuring the profiles of the semiconductor devices and applying the measured values to a table of known values to obtain the information.

8. A method for manufacturing an integrated circuit, comprising:
   forming semiconductor devices over a substrate, including;
     patterning gate structures on the substrate, each of the gate structures having a profile associated therewith; and
     obtaining information representative of the profiles of the gate structures, and feeding forward the information to alter a manufacturing parameter associated with a drive current of the semiconductor devices on a substrate-by-substrate basis; and
   forming interconnects within dielectric layers located over the semiconductor devices to form an operational integrated circuit.

9. The method as recited in claim 8 wherein obtaining information includes obtaining information using a scatterometer.

10. The method as recited in claim 8 wherein obtaining information representative of the profiles includes obtaining information representative of the critical dimensions of the gate structures.

11. The method as recited in claim 8 wherein obtaining information representative of the profiles includes obtaining information representative of sidewall angles of the gate structures.

12. The method as recited in claim 8 wherein feeding forward the information to alter a manufacturing parameter associated with a drive current of the semiconductor devices includes feeding forward the information to alter a source/drain anneal temperature.

13. The method as recited in claim 8 wherein feeding forward the information to alter a manufacturing parameter associated with a drive current of the semiconductor devices includes feeding forward information to alter a manufacturing parameter selected from the group consisting of sidewall spacer thickness, pocket/halo implant dose, pocket/halo implant energy, source/drain extension implant dose and source/drain extension implant energy.

14. The method as recited in claim 8 wherein obtaining information includes measuring the profiles of the semiconductor devices and applying the measured values to a table of known values to obtain the information.

15. A method for improving a drive current for semiconductor devices on a wafer-by-wafer basis, comprising:
   providing a plurality of wafers, each of the plurality of wafers having a plurality of gate structures located on a substrate thereof;
   measuring profiles of the gate structures of the semiconductor devices for each of the different plurality of wafers, the measured profiles providing information representative of the profiles of the gate structures of each of the wafers; and
   feeding forward, on a wafer-by-wafer basis, the information representative of the measured profiles for each of the wafers to alter a manufacturing parameter associated with a drive current of the gate structures for each of the wafers.

16. The method as recited in claim 15 wherein measuring profiles includes measuring profiles using a scatterometer.

17. The method as recited in claim 15 wherein measuring profiles includes measuring critical dimensions of the gate structures.

18. The method as recited in claim 15 wherein measuring profiles includes measuring sidewall angles of the gate structures.

19. The method as recited in claim 15 wherein feeding forward, on a wafer-by-wafer basis, the information representative of the measured profiles for each of the wafers to alter a manufacturing parameter associated with a drive current of the semiconductor devices includes feeding forward the information to alter a source/drain anneal temperature.

20. The method as recited in claim 15 wherein feeding forward, on a wafer-by-wafer basis, the information representative of the measured profiles for each of the wafers to alter a manufacturing parameter associated with a drive current of the semiconductor devices includes feeding forward the information to alter a manufacturing parameter selected from the group consisting of sidewall spacer thickness, pocket/halo implant dose, pocket/halo implant energy, source/drain extension implant dose and source/drain extension implant energy.

* * * * *